United States Patent [19]
Ozaki

[11] Patent Number: 6,128,403
[45] Date of Patent: Oct. 3, 2000

[54] WAFER MAP ANALYSIS AID SYSTEM, WAFER MAP ANALYZING METHOD AND WAFER PROCESSING METHOD

[75] Inventor: Hiroji Ozaki, Tokyo, Japan

[73] Assignee: Mitsubishi Denki Kabushiki Kaisha, Tokyo, Japan

[21] Appl. No.: 09/026,184

[22] Filed: Feb. 19, 1998

[30] Foreign Application Priority Data

Aug. 26, 1997  [JP]  Japan ................................. 9-229734

[51] Int. Cl.7 ................................................. G06K 9/00
[52] U.S. Cl. ..................... 382/145; 382/141; 382/147; 364/468.01; 364/489
[58] Field of Search ................. 364/468.01, 468.02, 364/468.03, 468.04, 488, 489, 490, 491; 382/145, 149, 151, 141, 144, 146, 147, 150; 348/85, 86, 87, 125, 126, 127

[56] References Cited

U.S. PATENT DOCUMENTS

| | | | |
|---|---|---|---|
| 5,673,198 | 9/1997 | Lawman et al. | 364/489 |
| 5,710,700 | 1/1998 | Kurtzberg et al. | 364/149 |
| 5,754,826 | 5/1998 | Gamal et al. | 395/500 |
| 5,777,876 | 7/1998 | Beauchesne | 364/468.01 |
| 5,787,190 | 7/1998 | Peng et al. | 382/145 |
| 5,838,951 | 11/1998 | Song | 395/500 |
| 5,870,308 | 2/1999 | Dangelo et al. | 364/489 |

FOREIGN PATENT DOCUMENTS

| | | |
|---|---|---|
| 1-304741 | 12/1989 | Japan . |
| 6-252020 | 9/1994 | Japan . |
| 8-335610 | 12/1996 | Japan . |

*Primary Examiner*—Amelia Au
*Assistant Examiner*—Vikkram Bali
*Attorney, Agent, or Firm*—Oblon, Spivak, McClelland, Maier & Neustadt, P.C.

[57] ABSTRACT

In order to solve various problems of a wafer, two-dimensional analysis using a wafer map is aided. An image of the wafer map is classified and displayed on a screen for each item such as a manufacturing step, a device and inspection. A trend chart is also attached in addition to the image of the wafer map.

22 Claims, 8 Drawing Sheets

WAFER MAP ANALYSIS AID SYSTEM, WAFER MAP ANALYZING METHOD AND WAFER PROCESSING METHOD

BACKGROUND OF THE INVENTION

1. Field of the Invention

The present invention relates to a wafer map analysis aid system and a wafer map analyzing method for analyzing various defects such as product failures caused in a semiconductor manufacturing process by using an image of a wafer map which is displayed on a monitor.

2. Description of the Background Art

In a semiconductor manufacturing line, a monitor wafer such as a bare wafer is used to check states of various manufacturing apparatus before a product lot is processed. More specifically, dummy operation of the manufacturing apparatus is performed to ascertain whether dust particles stick to a wafer for a test or not and to make a check on means of transportation, thereby confirming that the manufacturing apparatus is in a state suitable for manufacture. After the confirmation of the state, a predetermined number of product lots are manufactured. Numerical data obtained by the confirmation of the state of the apparatus and that obtained after the products are processed are utilized for quality control of the products by using a method such as statistical quality control. Examples of the numerical data include the number of dust particles sticking to a wafer, the number of defects generated on the wafer, dimensions of a pattern formed on the wafer, thicknesses of a film formed on the wafer, a measured value of mask alignment errors, impurity concentrations, resistances of the film formed on the wafer and the like.

Map data collected in the manufacturing line is required when it is doubtful whether a process of statistical quality control (SQC) is stable or not and when a wafer map and a chip are analyzed for lots having yields which are lower than a specified value. The cause of troubles are also analyzed by using data on electrical characteristics which are usually obtained after completion of manufacture or map data on a test result.

FIG. 7 is a conceptual view for explaining a structure of a wafer map analysis aid system according to the prior art. In FIG. 7, the reference numeral 10 denotes data on a manufacturing step, the reference numeral 11 denotes data on statistical quality control, the reference numeral 12 denotes map data, and the reference numeral 13 denotes data on section failure analysis. The data 10 on the manufacturing step includes numerical data measured at each manufacturing step in addition to a flow of manufacture. The flow of manufacture has a link corresponding to manufacture of each product at various steps such as a preprocessing step, a film forming step, a photolithographic step, an etching step, a defect inspecting step and the like. The data 10 on the manufacturing step is stored as a document, data of a computer and the like which are properly retrieved if necessary. The data 11 on the statistical quality control is processed and provided in simple form which is easy to see, for example, a graph. The map data 12 includes data on a test wafer which is used for apparatus management during dummy operation, data on a wafer which is extracted as a sample at an actual manufacturing step, and data obtained by performing various tests after a product is finished. Since the map data 12 represents various information on an image of the wafer, a data quantity is increased. The data 13 on the section failure analysis is related to an image of a wafer section which is observed by using a scanning electron microscope. The data 11 on the statistical quality control, the map data 12 and the like are also provided as documents and data of a computer.

FIG. 8 is a conceptual view showing an example of the relationship between a manufacturing step and a measuring apparatus. Steps ST1 to ST5 shown in FIG. 8 represent a preprocessing step, a film forming step, a photolithographic step, an etching step and a defect inspecting step. Dummy operation may be carried out at the film forming step before manufacture is started, thereby performing contamination inspection using a monitor wafer. An image 29 in a portion of the wafer to which dust particles have stuck is integrated as map data 19a. In some cases, the dummy operation is carried out at other steps.

After the film forming step ST2, a thickness of the formed film is measured to create map data 20a. For example, an image such as a wafer map 30 is obtained by the map data 20a. Similarly, a resist pattern and an etching pattern are measured or defect inspection is performed after the photolithographic step ST3, the etching step ST4 and the defect inspecting step ST5. Consequently, map data 21a to 23a are created. For example, images such as wafer maps 31 to 33 are obtained by using the map data 21a to 23a.

The wafer map analysis aid system according to the prior art serves to individually present the data 10 on the manufacturing step, the data 11 on the statistical quality control, the map data 12, the data 13 on the section failure analysis or the like only in the special case where it becomes clear after the manufacture that trouble occurred in the manufacturing step, stability of the step is doubtful or a lot having a lower yield than a specified value is generated.

The wafer map analysis aid system according to the prior art has the above-mentioned structure. Only numerical management is performed, and the map data and other text data such as events are not taken into consideration if defects are not caused. Therefore, the wafer map analysis aid system cannot fully function if the defects are not represented as numeric values on data.

In the case where numerical data on a test result are identical but numeric values of the data of which distribution on a wafer should normally be random have a distribution with a tendency, it is indicated that a possibility that trouble may occur in the near future is increased. If only the numerical management is performed, it is difficult to perform analysis for giving a warning of such a future possibility.

Furthermore, it is hard to analyze the extent of an influence on any device provided in the wafer by the statistical quality control using only numeric values. A factor of troubles cannot be grasped before failure analysis is performed. For this reason, the trouble which might be prevented if it is perceived in the middle of manufacture is missed so that all lots are involved in the trouble.

SUMMARY OF THE INVENTION

A first aspect of the present invention is directed to a wafer map analysis aid system comprising observing means for creating map data on a plurality of wafer maps obtained at each step of a semiconductor manufacturing process and for adding, to the map data, a linker indicating relation to the semiconductor manufacturing process, input means for inputting text data related to each of the wafer maps, storing means for storing predetermined data on the semiconductor manufacturing process, the map data having the linker added thereto which is sent from the observing means, and the text data sent from the input means, and image display means capable of displaying images related to the predetermined data on the semiconductor manufacturing process and the text data which are stored in the storing means, and capable of fetching the map data from the storing means to perform classification in accordance with the linker and of displaying an image of the wafer map described on the map data on a screen in accordance with the classification.

A second aspect of the present invention is directed to the wafer map analysis aid system according to the first aspect of the present invention, wherein the image display means graphically represents and displays numerical data in the text data, and visually distinguishably indicates a position on a graph representing numerical data on a specified wafer map.

A third aspect of the present invention is directed to the wafer map analysis aid system according to the first aspect of the present invention, wherein the map data includes information about absolute coordinates and absolute dimensions of each wafer map, and the image display means superposes and displays images of the wafer maps by using the information about the absolute coordinates and the absolute dimensions.

A fourth aspect of the present invention is directed to the wafer map analysis aid system according to the first aspect of the present invention, wherein the map data includes information about absolute coordinates and absolute dimensions of each wafer map, and the image display means superposes an image of the wafer map on an image of mask data and displays them by using the information about the absolute coordinates and the absolute dimensions.

A fifth aspect of the present invention is directed to the wafer map analysis aid system according to the first aspect of the present invention, wherein the map data includes information about absolute coordinates and absolute dimensions of each wafer map, and the image display means superposes an image of the wafer map on an image of a shape simulation and displays them by using the information about the absolute coordinates and the absolute dimensions.

A sixth aspect of the present invention is directed to a wafer map analyzing method for analyzing a wafer map by using an image displayed on image display means comprising the steps of creating map data on a plurality of wafer maps obtained at each step of a semiconductor manufacturing process and adding, to the map data, a linker indicating relation to the semiconductor manufacturing process, inputting text data related to each of the wafer maps, storing predetermined data on the semiconductor manufacturing process, the map data having the linker added thereto, and the input text data, and causing the image display means to display images related to the predetermined data on the semiconductor manufacturing process and the text data which are stored in order to analyze the wafer maps, and fetching the stored map data to perform classification in accordance with the linker and causing the image display means to display an image of the wafer map described on the map data in accordance with the classification.

According to the first or sixth aspect of the present invention, it is easy to visually distinguish a bias of two-dimensional data distribution by using the wafer map displayed on the image display means. Therefore, data analysis can be performed also in the middle of a manufacturing step without waiting for a termination of the manufacturing step.

According to the second aspect of the present invention, the relationship between the wafer map and the graph can directly be recognized visually. Therefore, an analysis efficiency can be enhanced.

According to the third aspect of the present invention, the wafer maps are superposed on each other. Consequently, a difference between positions of data represented on the wafer maps can visually be recognized. Thus, it is easy to visually compare the wafer maps with each other.

According to the fourth aspect of the present invention, it is possible to estimate a portion on a mask where there is a great possibility that abnormalities might be caused on the basis of the superposition of the wafer map on the mask. Thus, each layer can be analyzed.

According to the fifth aspect of the present invention, it is possible to observe a shape of a portion where there is a great possibility that an abnormality of a device might be caused on the basis of a shape simulation result in a portion corresponding to the position of the wafer map. A device section can be analyzed without using a real image.

In order to solve the above-mentioned problems, it is an object of the present invention to provide a wafer map analysis aid system which is convenient to predict, by means of a wafer map, a possibility that troubles such as abnormalities might be made in the middle of manufacture due to a tendency peculiar to a manufacturing apparatus, an omen of failures or a mask generated when changing production form.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
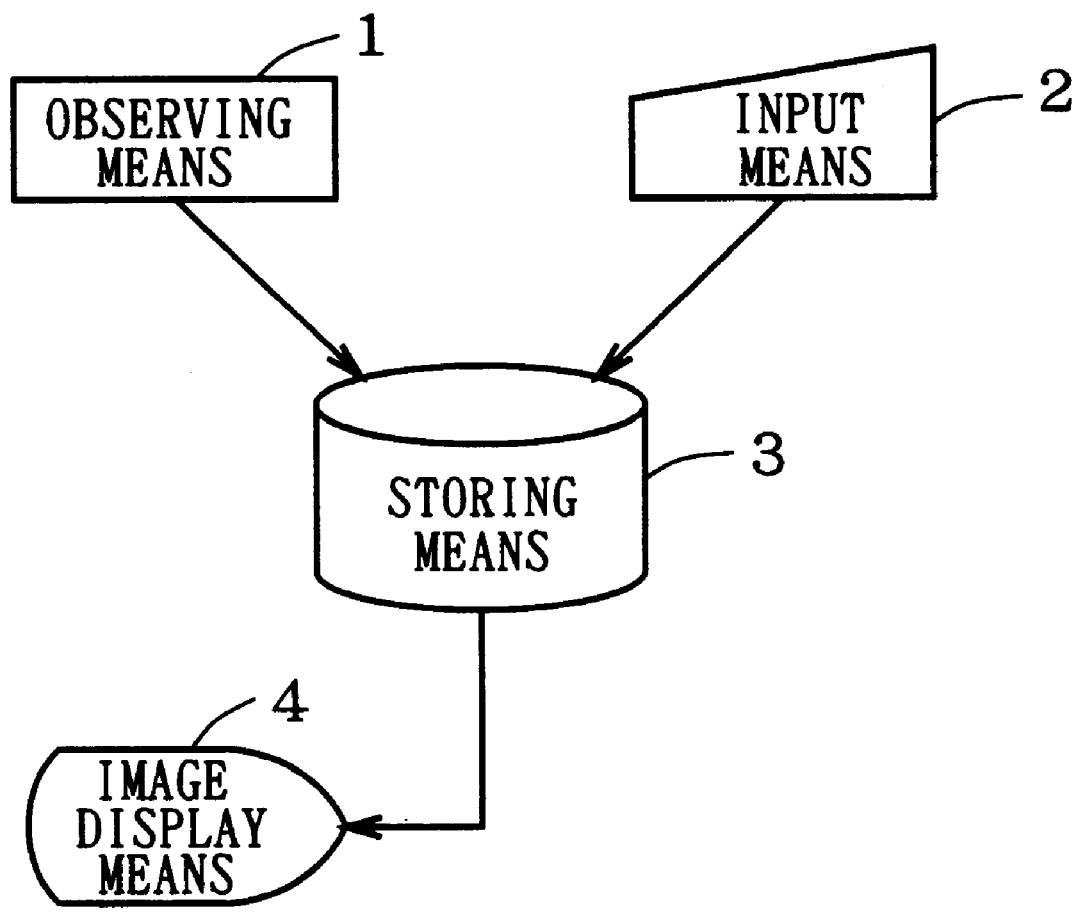
FIG. 1 is a block diagram showing an outline of a structure of a wafer map analysis aid system according to a first embodiment.

FIG. 1 is a block diagram showing a structure of a wafer map analysis aid system according to a first embodiment. In FIG. 1, the reference numeral 1 denotes observing means for creating map data on a plurality of wafer maps obtained at each step of a semiconductor manufacturing process and for adding, to the map data, a linker indicating relation to the semiconductor manufacturing process, the reference numeral 2 denotes input means for inputting numerical data related to each of the wafer maps, the reference numeral 3 denotes storing means for storing data on the semiconductor manufacturing process, the map data having the linker added thereto, and the numerical data, and the reference numeral 4 denotes image display means capable of displaying images related to the data on the semiconductor manufacturing process and the numerical data and capable of fetching the map data from the storing means to perform classification in accordance with the linker and capable of displaying an image of the wafer map described on the map data on a screen in accordance with the classification.

Figure 8:
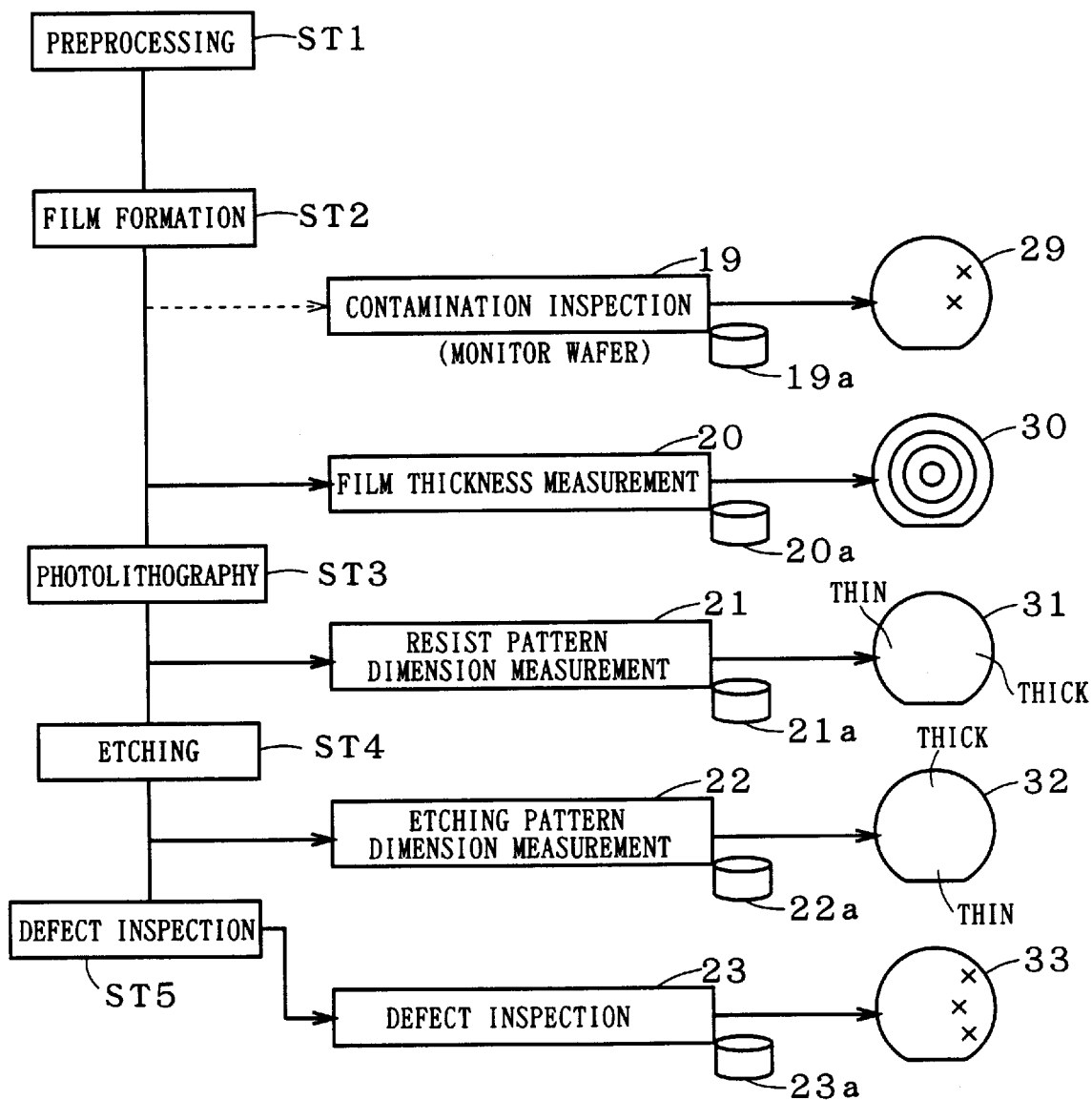
FIG. 8 is a conceptual view for explaining the relationship between a manufacturing step and a wafer map.

The observing means 1 includes various measuring devices such as a film thickness measuring device 20, a defect inspecting device 23 and the like shown in FIG. 8, for example. In the prior art, these devices have individually held data 20a to 23a. If line processors on a line, for example, the film thickness measuring device 20 or the like are connected to a computer on-line, a processing record summed up every time a processing is terminated in each device, for example, processing starting and ending dates and the like of each device are used to collect and process data by means of a CGI (Common Gateway Interface) or software such as JAVA (trademark) made by Sun Microsystems, Inc. The data thus collected and processed are stored as a database in the storing means 3. Data to be stored in the storing means 3 include a processing starting date, a processing ending date, a processing worker, a process sequence number of a lot, a process name, a processor code, a processing recipe, a processing parameter, a comment, the number of processing wafers, processing results and the like. The necessary data which are not directly transmitted from the observing means 1 are input to the storing means 3 by using the input means 2. Examples of the input means 2 include a terminal of a computer and the like. A data file format includes a file which can be dealt with by an optional HTML generation program, for example, CSV, SYLK and the like. A data update method includes "regular", "irregular", "automatic", "semiautomatic" and "manual" operations.

The necessary data stored in the storing means 3 is represented as character information or in a graph and is displayed on the image display means 4. In some cases, a graph displays the data by the device and by the apparatus. The necessary data include a processing starting date and a processing ending date of each processor. Therefore, arrangement of the data can be plotted on the condition that an optional processing date related to manufacture can be specified. In the case where an internet browser is used, it is possible to use means such as a method for converting a format of a file of which data have previously been represented graphically and for utilizing the same data, a method for linking a graph obtained from another application by using a plug-in for the browser itself, a method using a JAVA language and the like.

In the case where a processor of a manufacturing line is connected to a computer on-line, a wafer map is displayed on a screen every time a lot processing is terminated by each processor. If image data to be created is a non-compressed file such as a bit map, a format is converted into a compressed image file such as a GIF (Graphics Interchange Format), a JPEG (Joint Photographic Expert Group) or the like which can be displayed on the internet browser and one file or a file created by linking related files is formed into a database for each event. If a wafer map output device attached to the processor has no function of outputting a file, it is also possible to create a file which can be displayed on the internet browser by utilizing means for fetching the file output onto a paper with the use of a scanner, for example.

A wafer map obtained in a wafer process relates to thicknesses of an insulation film, thicknesses of a metal film, pattern dimensions, impurity concentrations, film resistances, pattern defects, contaminants, electrical characteristics and the like. A wafer map obtained when the wafer process is completed relates to electrical characteristics, a test result and the like. A data file format includes the GIF, the JPEG and the like which can be displayed on the internet browser. A data update method includes "regular", "irregular", "automatic", "semiautomatic" and "manual" operations.

Map data on the wafer map which are stored in the storing means 3 are displayed as images on the image display means 4. In that case, the observing means 1 adds data on a processing date as a linker to a file name inherent in a lot in order to clarify the relation between the map data 20a to 23a and a semiconductor manufacturing process.

Figure 2:
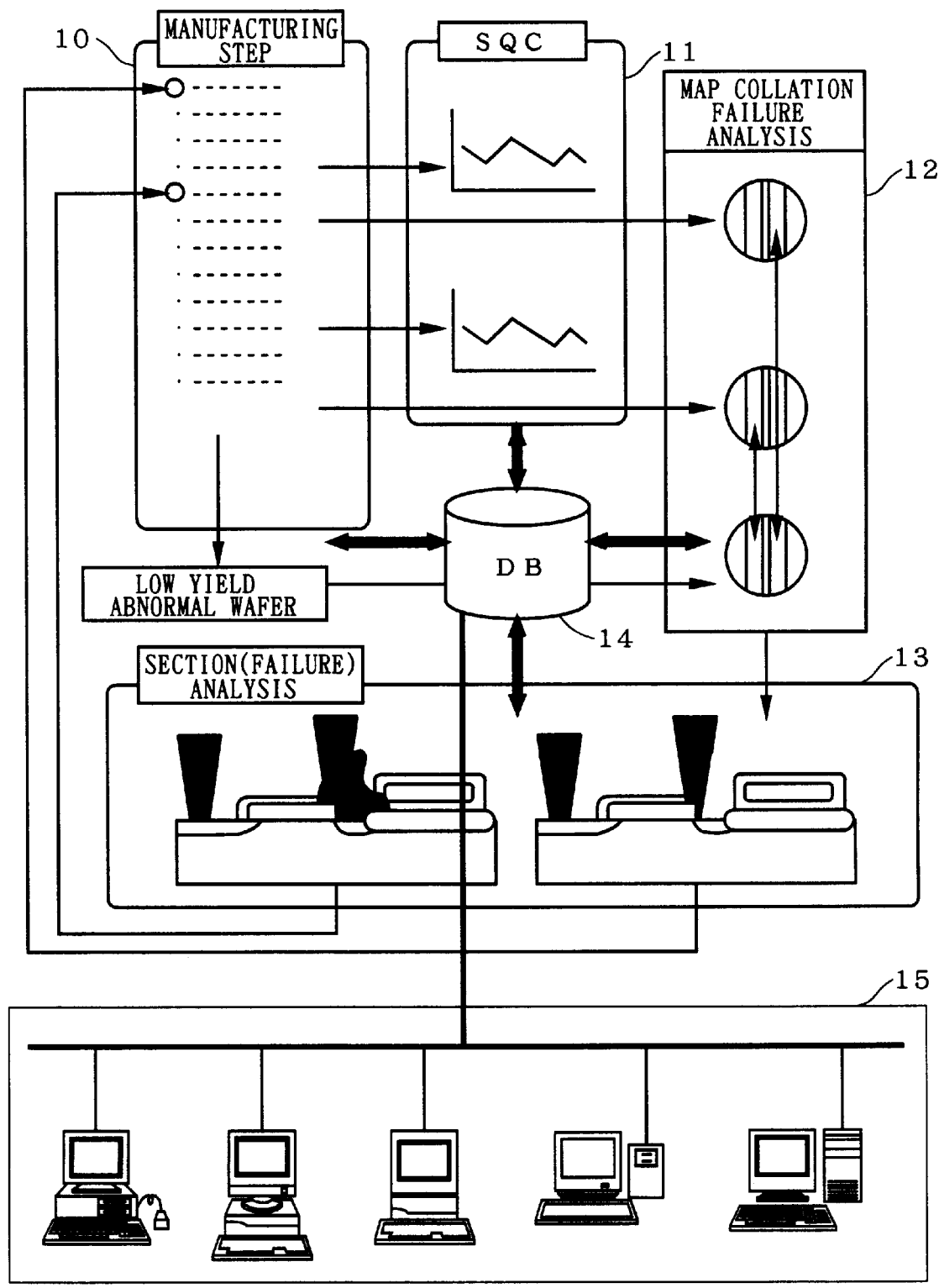
FIG. 2 is a conceptual view for explaining the structure of the wafer map analysis aid system according to the first embodiment.

FIG. 2 is a conceptual view showing a concept of the structure of the wafer map analysis aid system. FIG. 2 shows that data 10 on a manufacturing step, data 11 on statistical quality control, map data 12 and data 13 on section failure analysis are stored as a database 14 in the cases where the wafer map analysis aid system is implemented by using an internet browser and where a stand-alone application is constructed. For example, the map data 12 and the data 13 on the section failure analysis are sent from the observing means 1 to the storing means 3 and are stored as the database 14 in the storing means 3. For example, the data 10 on the manufacturing step and the data 11 on the statistical quality control are input from the input means 2 and are stored as the database 14 in the storing means 3. The database 14 is stored in the storing means 3 shown in FIG. 1. The database 14 is retrieved by means of a terminal 15. The terminal 15 is included in the image display means 4.

Figure 3:
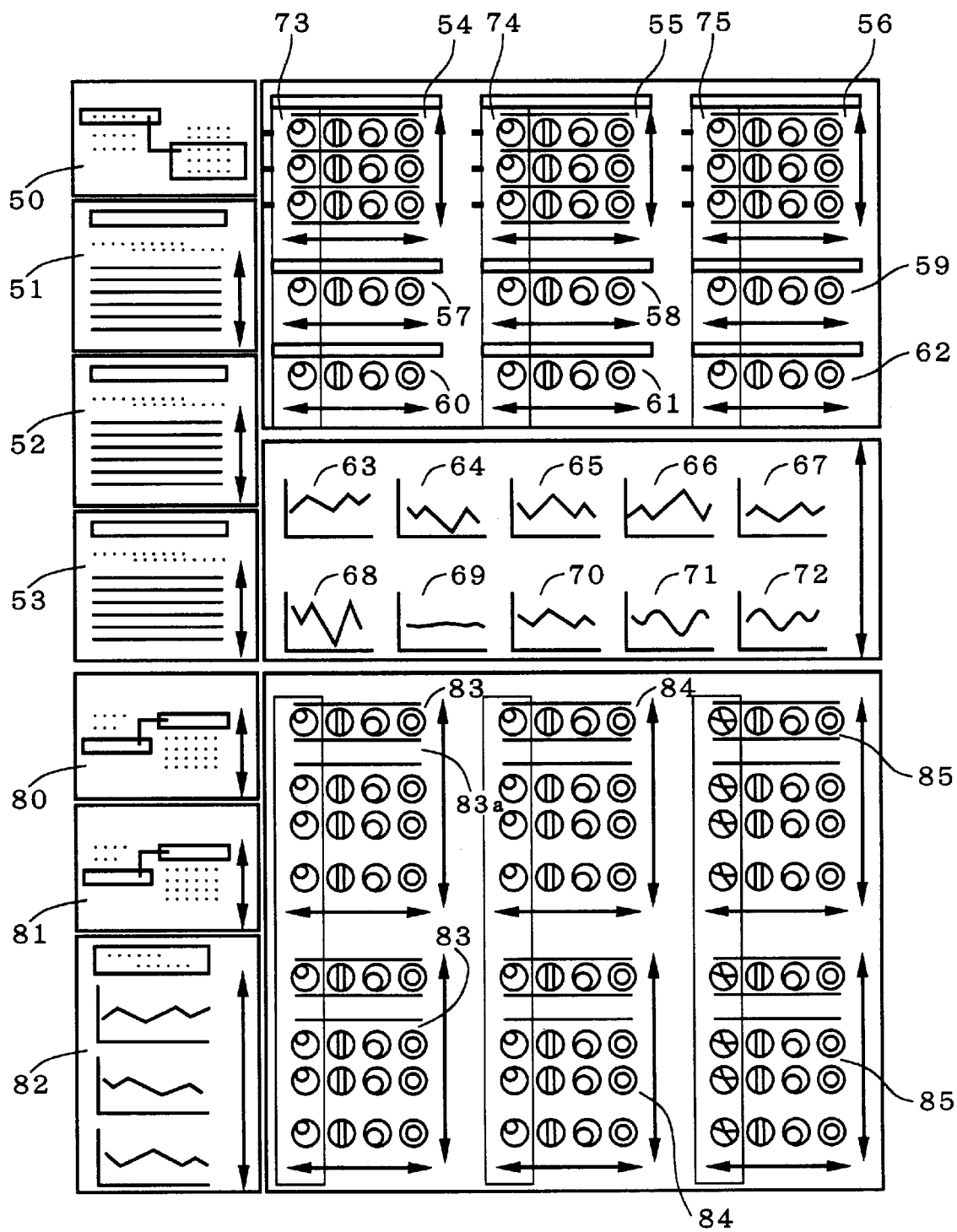
FIG. 3 is a pictorial view showing an example of a structure of a screen of the wafer map analysis aid system according to the first embodiment.

FIG. 3 is a pictorial view showing an example of a structure of a screen of the wafer map analysis aid system according to the first embodiment. The structure of the screen shown in FIG. 3 is generally divided into a region in an upper stage where data on a device are displayed and a region in a lower stage where data on apparatus information are displayed. The reference numeral 50 denotes a region where information about a device is displayed, the reference numerals 51 to 53 denote regions where information about a step of manufacturing three lots selected in the region 50 are described respectively, the reference numerals 54 to 56 denote a set of wafer maps which are related to the three lots respectively and are obtained at the manufacturing step, the reference numerals 57 to 59 denote a set of wafer maps which are related to the three lots respectively and are obtained by measuring electrical characteristics, the reference numerals 60 to 62 denote a set of wafer maps which are related to the three lots respectively and indicate test results, and the reference numerals 63 to 72 denote various trend charts.

The trend chart 63 relates to a change in a yield for a predetermined period of time, the trend charts 64, 67 and 72 relate to a change in film thickness for a predetermined period of time in portions which are different from one another, the trend charts 65 and 70 relate to a change in resist dimensions of a pattern for a predetermined period of time in portions which are different from each other, the trend charts 66 and 71 relate to a change in finished size of a pattern for a predetermined period of time in portions which are different from each other, the trend chart 68 relates to a change in impurity concentration for a predetermined period of time, and the trend chart 69 relates to a change in resistance value for a predetermined period of time.

A kind of a device, a lot number and the like are described in the region 50 where the information about the device is displayed. By selecting the lot number, information about a lot is described on the screen in the upper stage. In the regions 51 to 53 related to the manufacturing step are described a processing date, a sequence number, a step name, a recipe, a parameter, a processing result, a decision and the like for corresponding lots. A wafer map is displayed in three rows and four columns in the regions 54 to 56. In this case, a step and an apparatus are varied for various rows. In addition, a difference in the row can have a meaning which is different from a variation in the step and apparatus. As shown in FIG. 3, a screen layout can be formed in such a manner that processing results having the same wafer number can be arranged in one column (or one row) with a vertical or horizontal layout structure, a series of maps to be compared can be displayed in optional time series and a change in the map with time can be grasped. Frames 83 to 85 show wafer maps belonging to the same wafer number in respective lots. When all information cannot be described in the region, a screen may scroll in a direction shown by an arrow. Each map data may scroll on the screen and a menu on an operating system of a computer may first be displayed by scrolling.

The case where the wafer map analysis aid system is used for analyzing a factor of a lot having a low yield will be described below. A lot having a low yield and a standard lot are extracted from the trend chart 63. The extracted lot is selected from the lots displayed in the region 50. By performing the selection, a wafer map corresponding to the lot is displayed as shown in the regions 54 to 62, for example. A wafer map of the lot having a low yield is compared with that of the standard lot. Consequently, a tendency of distribution which is not possessed by the lot having a standard yield can easily be found out visually. After the wafer maps related to a series of lots are completely displayed, an abnormal wafer map is retrieved and wafer maps of the same kind of lots or various kinds of lots whose patterns approximate a pattern of the abnormal wafer map are retrieved.

A wafer map for displaying device information, a wafer map for displaying electrical characteristics, a wafer map for displaying a test result and the like are compared for the same device and various devices at the manufacturing step in a flexible manufacturing system line. For example, a DRAM has a wafer map for displaying a test result, for example, a fail bit map.

In FIG. 3, the reference numeral 80 denotes a region for selecting information about a manufacturing step, the reference numeral 81 denotes a region for selecting an apparatus, the reference numeral 82 denotes a region for displaying a trend chart indicating data for each apparatus, and the reference numerals 83 to 85 denote regions in which wafer maps of various apparatus are sequentially arranged downward from a top row in time series. A date of manufacture of a corresponding device or a period for specifying a range is displayed as the information about the manufacturing step in the region 80. The trend chart displayed in the region 82 serves to supervise data of the apparatus.

The case where incidental data is used after retrieval of wafer maps to estimate the cause of generation of abnormal wafer maps by the wafer map analysis aid system will be described below. Irrespective of lots and apparatus information, a date of manufacture of a corresponding device or a range of a manufacturing period is specified so that all map data are displayed in time series (regions 83 to 85). The apparatus data also include text data such as a processing history, a maintenance history, an alarm history, a regular contamination check and the like. In particular, a wafer map for the regular contamination check which is obtained by using a monitor wafer displays an image by using a column indicated at 86 together with other text information. Wafer maps are arranged with the same wafer number in such a manner that a history of measuring wafers can be confirmed in the same manner as display of the wafer map in the device. In each of the regions 83 to 86 shown in FIG. 3, one column has the same wafer number.

Thus, if abnormal wafer maps are found out in the middle of the manufacture or after the completion of the manufacture, the information about the manufacturing step shown in the low stage of FIG. 3 are aggregated on the screen so that the cause of generation of the abnormal wafer maps and a date of the generation thereof can be specified. The cause of generation of an abnormal lot is found by the abnormal wafer maps. The manufacturing line involved in the abnormal lot is controlled for removing the cause of the abnormal lot. After the manufacturing line is controlled, normalization of all lots of wafers which are manufactured on the manufacturing line is expected.

Furthermore, a list of lots which might have got the same trouble at the same period is also retrieved from the region 80 by using all processing histories so that measures can easily be taken and a lot which might have got the trouble can precisely be processed.

In FIG. 3, the first region 50, the second regions 51 to 53, the third regions 54 to 56, the fifth regions 57 to 59, the sixth regions 60 to 62, the seventh regions 63 to 72, the eighth region 80, the ninth region 81, and the tenth regions 83 to 85 are supplied from separate HTML (Hyper Text Markup Language) sources for the regions, that is,10 HTML sources in total. Referring to data necessary for each HTML source, new file creation/data update are performed at the time of data update. In the case where all data are transmitted from one worldwide web server, all data including a text and an image file are stored in the worldwide web. On the other hand, the worldwide web server can be distributed depending on a kind of the data. In this case, the text can be linked to the image file by the HTML by checking a directory of the distributed file. Any tool for creating the HTML can be used.

A HTML for coupling each screen shown in FIG. 3 by using a frame function thereof is created so that a desired data browser is completed.

While the case where three lots are compared has been described in the first embodiment, the present invention can be used for analyzing failures of only one lot or other lots. If control is performed by the internet browser, the HTML is used. If the control is implemented with a stand-alone application, programming is performed within the same application.

Figure 4:
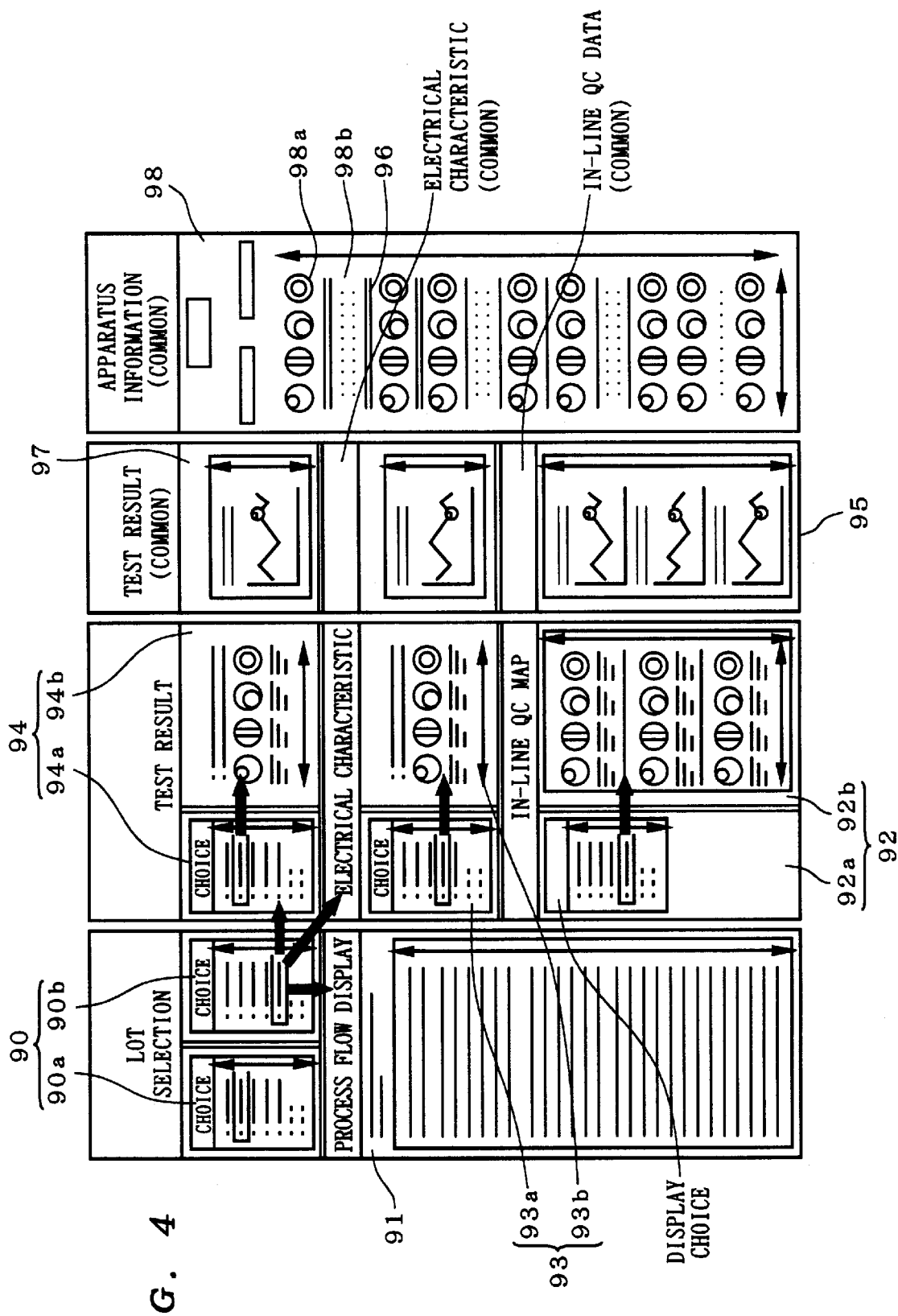
FIG. 4 is a pictorial view showing another example of the structure of the screen of the wafer map analysis aid system according to the first embodiment.

An example in which only one lot is selected to perform data analysis will be described below with reference to the drawing. FIG. 4 is a pictorial view showing a screen of the image display means 4. When the screen shown in FIG. 4 is displayed, an operator first selects a kind of a device from a choice 90*a* of the device in a lot selection region 90. For example, the choice 90*a* includes a DRAM type I, an SRAM type XI and the like. By selecting the device, lots are displayed on a choice 90*b*. A lot is selected. A set of wafer maps obtained at the manufacturing step and a comment 92*b* on the same set, a set 93*b* of wafer maps obtained by measuring electrical characteristics, and a set 94*b* of wafer maps indicating a test result are displayed for the selected lot. A processing sequence, a chart number and a test number are selected to change objects in choices 92*a* to 94*a* displayed in an in-line QC map region 92, an electrical characteristic region 93 and a test result region 94, respectively. The data are also represented graphically in an in-line QC data region 95, an electrical characteristic region 96 and a test result region 97, respectively. Yields, film thicknesses and resist dimensions are represented in graphs related to the manufacturing step. Each of the electrical characteristics and the test results is represented in a graph indicating the yield. As is apparent from the graph, a lot whose wafer map is displayed is indicated by a circle. An apparatus information region 98 has a structure in which a wafer map and an event description can change display in time series by selecting an apparatus and a date range.

Second Embodiment

Figure 5:
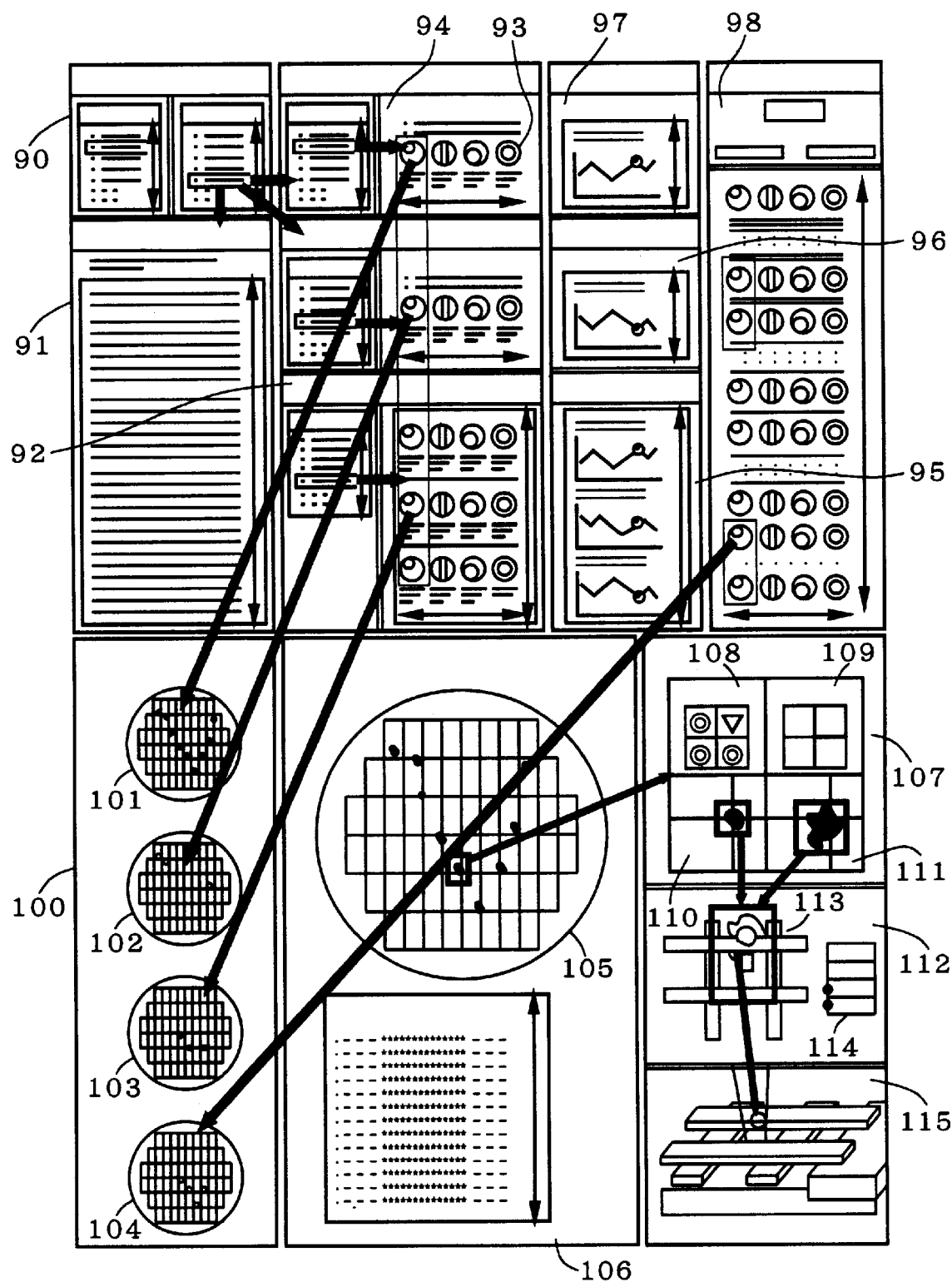
FIG. 5 is a pictorial view showing an example of a structure of a screen of a wafer map analysis aid system according to a second embodiment.

FIG. 5 is a pictorial view showing a structure of a screen of a wafer map analysis aid system according to a second embodiment. An upper stage shown in FIG. 5 relates to numerical data and map data, and is the same as in FIG. 4. A lower stage shown in FIG. 5 is a display for analysis performed by synthesis of wafer maps. The display in the lower stage also includes mask data and simulation image data in addition to the wafer maps related to the synthesis. The wafer map is displayed in a region 100 where an original map for map synthesis acting as a material for the synthesis is displayed. Original maps 101 to 104 displayed in the region 100 are wafer maps selected from each region in the upper stage. The original maps 101 to 104 are synthesized to create a synthetic map 105.

Figure 6:
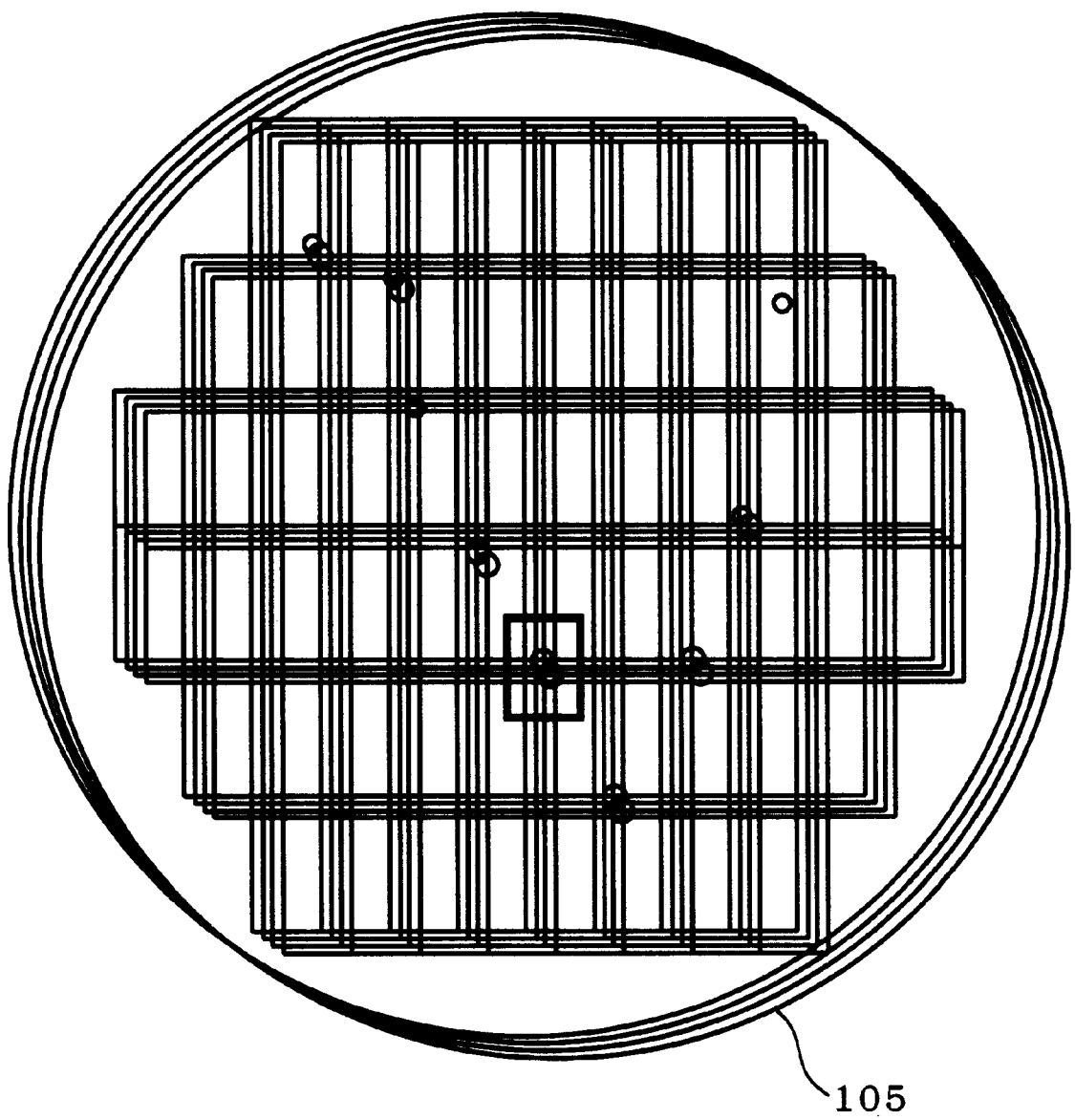
FIG. 6 is an enlarged view showing a synthetic map shown in FIG. 5.
Figure 7:
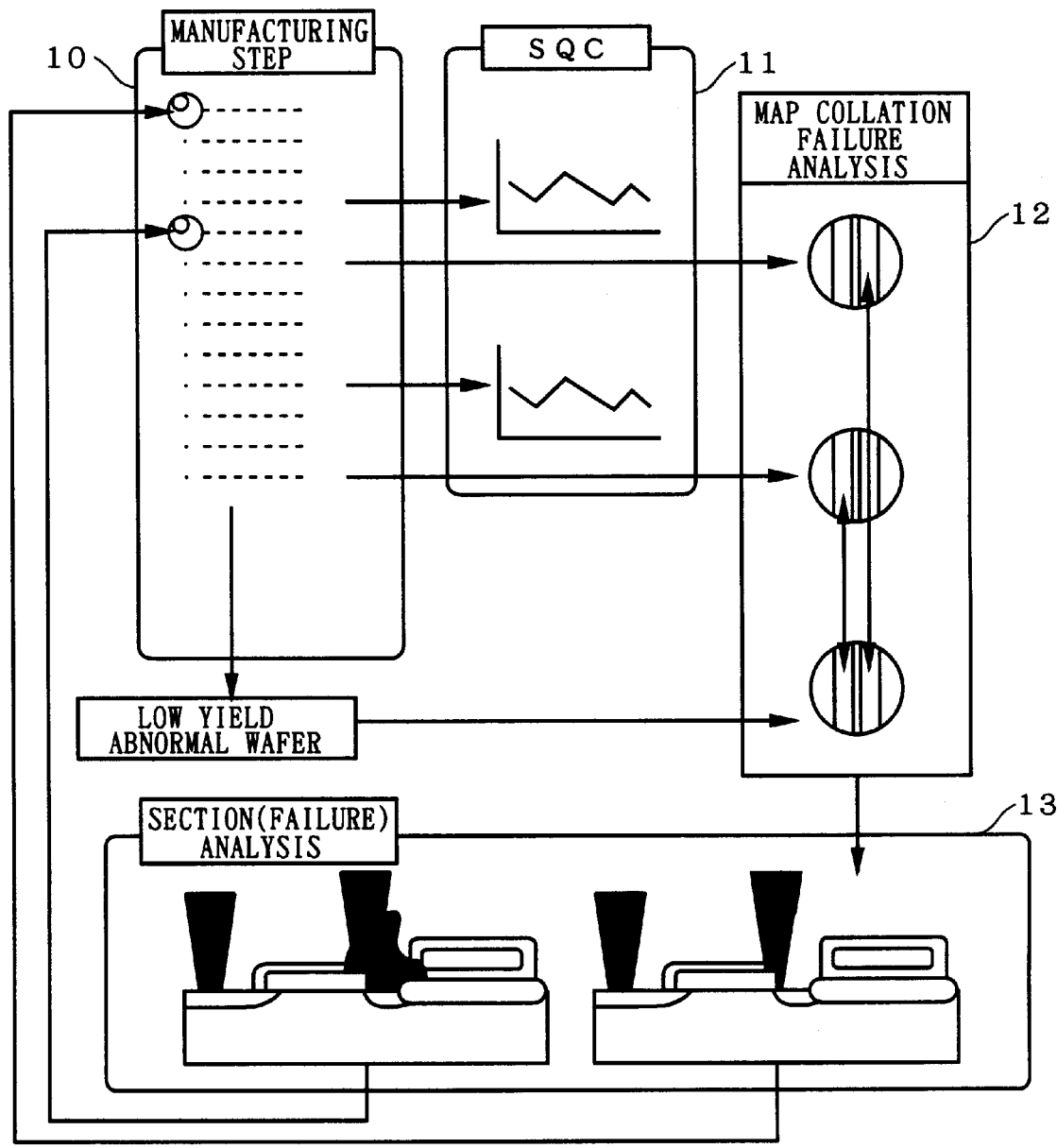
FIG. 7 is a conceptual view for explaining a structure of a wafer map analysis aid system according to the prior art.

The maps are synthesized in the following manner. By using the image display means 4 shown in FIG. 1, the map data in the upper stage shown in FIG. 5 are selected and individual wafer maps are subjected to color setting including a transparency in such a manner that information can be distinguished even if the individual wafer maps overlap each other. Next, the original maps 101 to 104 are arranged on a list display screen. The original maps 101 to 104 are subjected to coordinate transformation by using absolute coordinates taken over from each map data so as to have common coordinates. The original maps 101 to 104 have absolute dimensions taken over from the map data, and are superposed in such a manner that dimensions of the superposed maps reflect a ratio of actual dimensions in consideration of the absolute dimension. Original maps to be further synthesized are selected from the original map region 100 for map synthesis, thereby synthesizing the maps. The synthetic map 105 shown herein is formed by offset, that is, each original map is completely superposed and displayed. For this -reason, the superposition of the original maps can easily be perceived. As shown in FIG. 6, the original maps may be offset and displayed. In that case, images indicating a wafer and a chip therein are identical to one original map. Coordinates, sizes, classification and the like for the synthesized original maps are displayed in a region 106 provided under the synthetic map 105. A list in a synthesis result of the region 106 is selected by means of a pointer of a mouse or the like so that points corresponding to the same list in the synthetic map 105 flash.

Furthermore, a part of the synthetic map 105 can be enlarged to aid analysis. An enlarged map synthesis view 107 shows a portion specified in the synthetic map 105. The original map 101 displays a test result. Therefore, test data in only a boundary portion of an enlarged chip are displayed by symbols indicating an excellent product (double circle), nonconformity to specification (triangle) and the like in a region 108 which displays an enlarged view of the original map 101. The original map 101 reflects an absolute dimension on chip arrangement and the like. In a region 109 which displays an enlarged view of the original map 102, an electrical characteristic result for an enlarged chip boundary is displayed with a numeral indicative of "standard" or "nonstandard". For example, it is assumed that the "standard" is set to 0.2 and the "nonstandard" is set to 1.5. The original map 102 also reflects the absolute dimension on the chip arrangement and the like. The original map 103 displays a contaminant on a product wafer at a manufacturing step. Therefore, a boundary line of an enlarged chip and a contaminant are displayed in a region 110 which displays an enlarged view of the original map 103. A size of the contaminant and that of the wafer are displayed at a correct ratio in consideration of absolute dimensions. The original map 104 displays a state of dust particles on the wafer for checking a state of an apparatus. Therefore, the boundary line of the enlarged chip and the dust particles sticking to the wafer are displayed in a region 111 which displays an enlarged view of the original map 104. A size of the dust particle and that of the wafer are displayed at a correct ratio in consideration of absolute dimensions. The original maps 101 and 102 can display measurement results by a HTML. Image data are exactly used for the original maps 103 and 104. Enlarged image data are displayed after coordinates and sizes are set equal among the maps. At the time of enlargement, it is desirable that a resolution should be set equal for visually identical recognition and comparison.

The mask data and the wafer map are superposed in a region 112. The image display means 4 shown in FIG. 1 creates coordinates which are common to both the mask data and the wafer map. By using the common coordinates, mask data in portions corresponding to the coordinates shown in the regions 110 and 111 are displayed. At the same time, the enlarged view related to the contaminant shown in the region 110 is superposed on the enlarged view related to the dust particles shown in the region 111. First and second layers of the mask data are represented in a display 113 of the superposition. By comparing the mask data with the map data on the wafer, it is possible to clearly find out a wiring layout provided under an interlayer dielectric film which is hard to identify at the manufacturing step. Consequently, an influence of contaminant generation on the chip can be grasped at the manufacturing step according to the relationship between the contaminant or dust particles and the wiring layout. A display 114 of the region 112 indicates the superposed original maps. The mask data is input from the input means 2 and is stored in the storing means 3.

Similarly, a shape simulator can be superposed on the map data. If the coordinates of the wafer can be specified, they are converted into a position of the shape simulator to make the position of the shape simulator coincident with the coordinates of the wafer by the image display means 4. Consequently, if the coordinates of the wafer can be specified, a portion where the dust particles or the contaminants stick can be displayed according to the shape simulator so that it is possible to verify a failure to which a portion of generation of abnormalities is related. A shape simulation result is input from the input means 2 and is stored in the storing means 3. The relationship between a position on the wafer map and that of the shape simulator is displayed in a region 115. In the region 115, an image is created by a shape simulation with the same image resolution as that of the wafer map and is represented in three dimensions with coordinates and sizes unified.

In the case where the above-mentioned function is implemented by using an internet browser, the map data, the map synthetic data, the data on the enlarged view and the data on the shape simulator are linked by a clickable map or a middleware interface such as a CGI. In the case where the above-mentioned function is implemented by using the internet browser, split screens shown in FIG. 5 are coupled by using a frame function of the HTML so that a desired data browser can be completed. In the case where the above-mentioned function is converted into dedicated applications, the number of pixels in which data overlaps with a map synthetic language is calculated to set a threshold. Thus, causality of layers can also be calculated automatically.

While the map synthesis obtained from one lot has been described in the second embodiment, it can also be performed by using map data on a plurality of optional lots in the same manner. If the lots are used, it is possible to verify disorder of an apparatus and the like according to similarity of maps at one step, for example While the case where the screen of the wafer map is subjected to the coloring setting and the map synthesis is then performed has been described in the second embodiment, it is also possible to change the setting on a map synthetic screen or to perform a vertical motion between the layers.

According to the second embodiment, the wafer map is used to display images of the mask data or other data such as the shape simulation in two or three dimensions, for example. Consequently, data analysis can be performed. It is needless to say that the wafer map analysis aid system can function even if these data are not used together.

While all the data have been aggregated on one screen of one terminal in the first and second embodiments, the data may be split and displayed on a plurality of monitors to obtain the same effects as those in the first and second embodiments.

While a database and a computer for managing each data have not been described in the first and second embodiments, the data may be aggregated on one hardware or may be distributed on some hardware. Each data can be retrieved on-line by means of one computer. It is sufficient that the data are linked to each other.

While the first and second embodiments have described examples in which the internet browser is used and the GIF and the JPEG are utilized for the image data on image display, any data format of the image data can be used if it can be displayed on the browser by using a plug-in data converting tool. While there has been described a data construction in which the resolutions of all kinds of wafer maps are synthesized and an analysis efficiency is the highest, the present invention can also be applied to the case where the resolutions of the images of all the wafer maps are not coincident with one another and the sizes are varied.

While a link to the map data has not been described in the first and second embodiments, it is also possible to link an SEM image photo observed in a which is being manufactured and the like to a step, a trend chart and the like, and to link the trend chart to a document.

While the invention has been described in detail, the foregoing description is in all aspects illustrative and not restrictive. It is understood that numerous other modifications and variations can be devised without departing from the scope of the invention.

I claim:

1. A wafer map analysis aid system comprising:
observing means for executing inspection or measurement on wafers at plural steps of a semiconductor manufacturing process to which said wafers are subjected, to thereby create plural wafer map data which are image data respectively capable of representing results of said inspection or said measurement at said plural steps on images of said wafers as wafer maps, and for adding, to said plural wafer map data, linkers respectively indicating relation to said plural steps;

input means for inputting text data related to said plural steps;

storing means for storing said plural wafer map data respectively accompanied with said linkers sent from said observing means and said text data sent from said input means; and image display means capable of displaying images of said text data stored in said storing means on a screen, and capable of fetching a specified part of said plural wafer map data from said storing means in accordance with said linkers to thereby display those images on said screen which said part of wafer map data represent as part of said wafer maps.

2. The wafer map analysis aid system according to claim 1, wherein
each of said linkers includes a file name with a processing date, said file name being inherent in a lot.

3. The wafer map analysis aid system according to claim 1,
wherein said text data includes numerical data, and
said image display means displays said numerical data in a graph and visually distinguishably indicates a position or positions of said specified part of said plural wafer map data on said graph.

4. The wafer map analysis aid system according to claim 1, wherein
said plural wafer map data include information about absolute coordinates and absolute dimensions of said respective wafer maps, and
said image display means superposes and displays plural images of said part of wafer maps by using said information.

5. The wafer map analysis aid system according to claim 1, wherein
said plural wafer map data include information about absolute coordinates and absolute dimensions of said respective wafer maps, and
said image display means superposes an image of said part of wafer maps on an image of mask data and displays them by using said information.

6. The wafer map analysis aid system according to claim 1, wherein
said plural wafer map data include information about absolute coordinates and absolute dimensions of said respective wafer maps, and
said image display means superposes an image of said part of wafer maps on an image of a shape simulation and displays them by using said information.

7. The wafer map analysis aid system according to claim 1, wherein said image display means displays said images which said part of wafer map data represent as said part of said wafer maps on said screen in a predetermined order based on said linkers.

8. A wafer map analyzing method for analyzing a wafer map displayed as an image on an image display means comprising steps of:
executing inspection or measurement on wafers at plural steps of a semiconductor manufacturing process to which said wafers are subjected, to thereby create plural wafer map data which are image data respectively capable of representing results of said inspection or said measurement at said plural steps on images of said wafers as wafer maps, adding, to said plural wafer map data, linkers respectively indicating relation to said plural steps;

inputting text data related to said plural steps;

storing said plural wafer map data respectively accompanied with said linkers and said inputted text data; and causing said image display means to display images of said stored text data, to fetch a specified part from said stored plural wafer map data in accordance with said linkers, and to thereby display images which said part of wafer map data represent as part of said wafer maps.

9. The wafer map analyzing method according to claim 8, wherein each of said linkers includes a file name with a processing date, said file name being inherent in a lot.

10. The wafer map analyzing method according to claim 8, wherein said text data includes numerical data, said step of causing said image display means to display images of said stored text data includes a step of:

displaying said numerical data in a graph, and said wafer map analyzing method further comprises a step of:

causing said image display means to visually distinguishably indicate a position or positions of said specified part of said plural wafer map data on said graph.

11. The wafer map analyzing method according to claim 8, wherein said plural wafer map data include information about absolute coordinates and absolute dimensions of said respective wafer maps, and said step of causing said image display means to display images which said part of wafer map data represent includes a step of:

causing said image display means to superpose and display plural images of said part of wafer maps by using said information.

12. The wafer map analyzing method according to claim 8, wherein said plural wafer map data include information about absolute coordinates and absolute dimensions of said respective wafer maps, and said step of causing said image display means to display images which said part of wafer map data represent includes a step of:

causing said image display means to superpose an image of said part of wafer maps on an image of mask data and display them by using said information.

13. The wafer map analyzing method according to claim 8, wherein said plural wafer map data include information about absolute coordinates and absolute dimensions of said respective wafer maps, and said step of causing said image display means to display images which said part of wafer map data represent includes a step of:

causing said image display means to superpose an image of said part of wafer maps on an image of a shape simulation and display them by using said information.

14. The wafer map analyzing method according to claim 8, wherein said step of causing said image display means to display images which said part of wafer map data represent as part of said wafer maps includes a step of:

causing said image display means to display said images which said part of wafer map data represent as said part of aid wafer maps in a predetermined order based on said linkers.

15. A wafer processing method, comprising steps of:

processing a plurality of first wafers included in a first lot by a predetermined manufacturing line;

executing inspection or measurement on said first wafers at plural steps of a semiconductor manufacturing process of said predetermined manufacturing line to which said first wafers are subjected, to thereby create plural wafer map data which are image data respectively capable of representing results of said inspection or said measurement at said plural steps on images of said first wafers as wafer maps, adding, to said plural wafer map data, linkers respectively indicating relation to said plural steps;

inputting text data related to said plural steps;

storing said plural wafer map data respectively accompanied with said linkers and said inputted text data;

causing said image display means to display images of said stored text data, to fetch a specified part from said stored plural wafer map data in accordance with said linkers, and to thereby display images which said part of wafer map data represent as part of said wafer maps;

analyzing a processing of said plurality of first wafers by said wafer maps;

controlling said predetermined manufacturing line by using an analysis result of said wafer maps; and processing a plurality of second wafers included in a second lot by said predetermined manufacturing line which is controlled.

16. The wafer processing method according to claim 15, wherein said step of causing said image display means to display images which said part of wafer map data represent as part of said wafer maps includes a step of:

causing said image display means to display said images which said part of wafer map data represent as said part of a said wafer maps in a predetermined order based on said linkers.

17. A method of displaying manufacturing information, comprising:

generating semiconductor manufacturing process wafer map data for respective ones of a plurality of semiconductor manufacturing steps;

generating information linking said map data with respective ones of said steps;

displaying first information relating to at least one of a device used in one of said steps and at least one of a group of wafers processed by said device;

selecting at least one piece of said first information; and automatically displaying semiconductor wafer map data corresponding to said one piece of said first information using said linking information based upon said selecting step.

18. A method as recited in claim 17, comprising:

generating numerical data relating to said map data;

automatically displaying said numerical data corresponding to said one piece of said first information based upon said selecting step.

19. A method as recited in claim 17, comprising:

generating electrical characteristics data;

generating electrical test data; and automatically displaying electrical characteristics data and electrical test data related to said one piece of said first information.

20. A method as recited in claim 17, comprising:

generating manufacturing trend data; and displaying said trend data with said wafer map data.

21. A method as recited in claim 17, comprising:

generating synthesized wafer map data from said wafer map data; and displaying said synthesized wafer map data with said wafer map data.

22. A method as recited in claim 17, comprising:

generating mask data related to said manufacturing process; and displaying said mask data with said wafer map data.

* * * * *